March 30, 1954 A. S. KHOURI ET AL 2,673,949

PRINTED CIRCUITS, INCLUDING LOW-TEMPERATURE COEFFICIENT CAPACITOR

Filed Nov. 18, 1950 2 Sheets-Sheet 1

INVENTORS.
ALFRED S. KHOURI
BY DONALD H ZUNKER

John W. Michael

ATTORNEY

INVENTORS.
ALFRED S. KHOURI
DONALD H. ZUNKER
BY John W. Michael
ATTORNEY

Patented Mar. 30, 1954 2,673,949

UNITED STATES PATENT OFFICE 2,673,949

PRINTED CIRCUITS, INCLUDING LOW-TEMPERATURE COEFFICIENT CAPACITOR

Alfred S. Khouri and Donald H. Zunker, Milwaukee, Wis., assignors to Globe-Union Inc., Milwaukee, Wis., a corporation of Delaware Application November 18, 1950, Serial No. 196,364

3 Claims. (Cl. 317—242)

This invention relates to improvements in printed circuit units and particularly to units which incorporate on a high dielectric constant ceramic base a closely toleranced, low value, low temperature coefficient capacitor.

Hereinafter "dielectric constant" will be designated by the standard symbol "K" and "temperature coefficient" will be designated by the symbol "TC."

All commonly used high dielectric constant ceramics have high TC's, either positive or negative, or a combination. For example, one ceramic dielectric material commonly used in printed circuit work has a dielectric constant of 6000 at its curie point at room temperature (20° C.). However, as the temperature is changed in either direction the capacity will drop off. In a 50° C. change it will decrease by 50%. This is a TC of +10,000 p. p. m. below the curie point and −10,000 p. p. m. above the curie point. Capacitors of a printed circuit developed on such a material will have a tremendous variation with temperature, and, considering the likely temperature excursion they will be subjected to, will have to be broadly toleranced.

In many circuits the large value coupling or bypass capacitors are not critical. It is necessary to use a high K material of the type discussed in order to obtain the large capacity values needed and on the capacitors for which it is used the necessarily broad capacity tolerance is permissible. However, associated with these circuits will be low value, closely toleranced capacitors such as used for feedback or in resonant circuits. Heretofore these capacitors were left off of the printed circuit and attached externally in the circuit.

It is an object of this invention, therefore, to provide a printed circuit unit having a high K ceramic base which incorporates a low value, low TC capacitor capable of close tolerancing.

This object is obtained by interposing between a high K ceramic base and one plate of a low value low TC capacitor, the plates of which are on opposite sides of the base, a relatively thin layer of low K, low TC dielectric material, such as a glaze. This material is bonded to the ceramic base and such plate is bonded to the outer surface of such material. The effect electrically is the same as if two capacitors, one of which has a high capacitance and high TC and the other of which has a low capacitance and a low TC, are connected in series. The result is a total capacitance lower than the capacitance of the lowest capacitor of the series and a total TC which is a minute fraction (for example less than 3%) of the TC of the capacitor of the series which has highest TC. By proper selection of the TC characteristic of the thin layer dielectric material it is possible to obtain a total TC of zero. Thus a low value, low TC, close toleranced capacitor is bonded on a high K base capable of forming the support and dielectric of other impedance elements of a printed circuit.

The novel features, which are considered characteristic of the invention, are set forth with particularity in the appended claims. The invention itself, however, both as to its organization and its method of operation, together with additional objects and advantages thereof, will best be understood from the following description of a specific embodiment when read in connection with the accompanying drawings in which:

Figure 2:
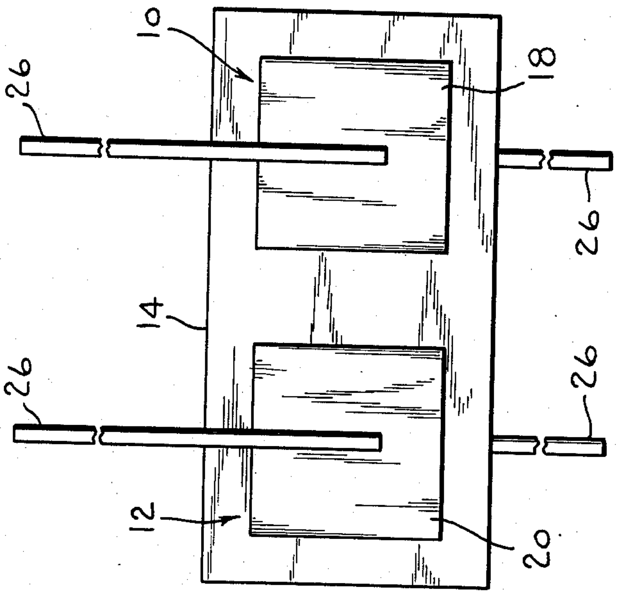
Fig. 2 is a bottom plan view of the unit viewed in Fig. 1.
Figure 1:
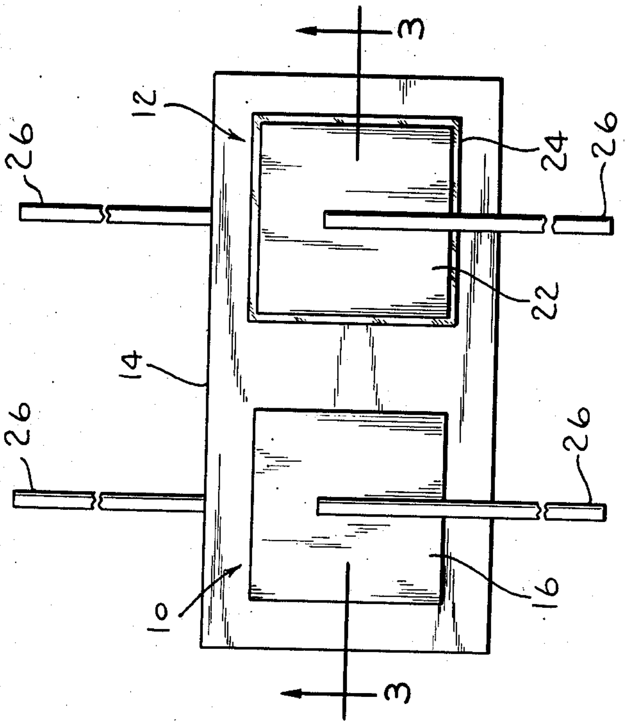
Fig. 1 is a top plan view of a printed circuit unit embodying the present invention.
Figure 3:
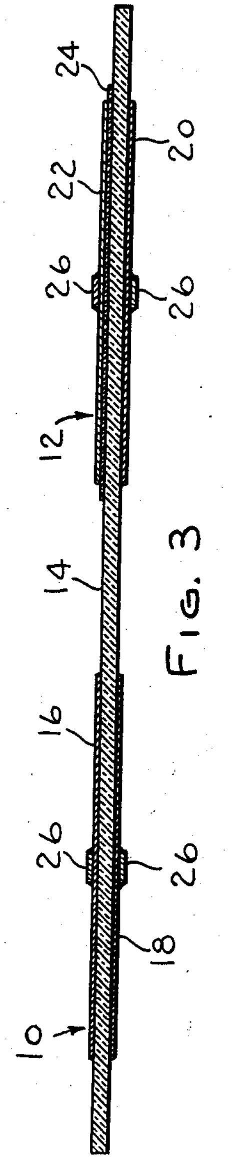
Fig. 3 is an enlarged sectional view taken on line 3—3 of Fig. 1.
Figure 4:
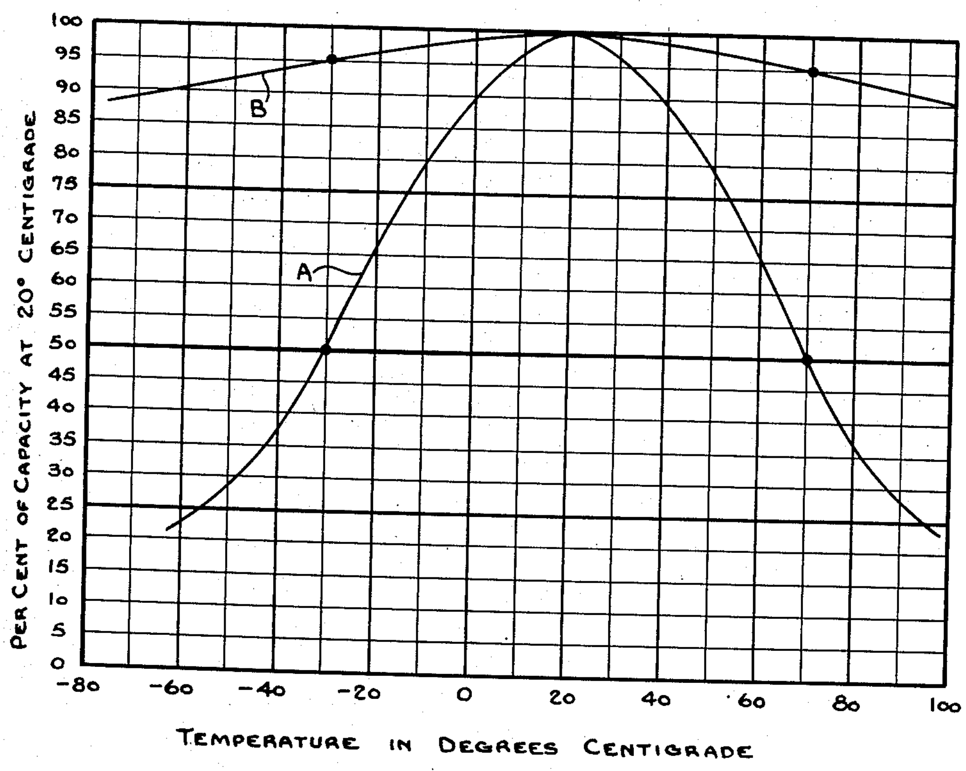
Fig. 4 is a chart illustrating the comparative performance curves of the high capacitor and the low value low TC capacitor of such unit.

The unit shown in the drawing while not responding to the characteristic definition of a printed circuit unit because there are no diverse impedance elements such as resistors or inductances electrically connected with the capacitors, nevertheless illustrates how a low value, low TC capacitor can be deposited on a high K base capable of forming a support for a printed circuit unit. Other impedance elements (not shown) may be deposited on the high K base 14 and connected in desired circuits in a well-known manner. A high value capacitor 10 is shown primarily to provide a standard with which the low value capacitor 12 may be compared. The performance curves of the high value capacitor 10 and the low value capacitor 12 are illustrated respectively by the curves A and B on the chart of Fig. 4. The capacitor 10 may become a part of a circuit printed on the high K base. As the purpose of this invention is to incorporate a closely toleranced capacitor upon a high K base, the base 14 of the embodiment of the drawings is made of a ceramic material having a high K of 500 to over 10,000. The ceramic material comprising a mixture of basically titanate dioxide with added material such as rare earths or various titanates gives excellent results and is sufficiently strong and rigid to form a support for the unit. A base of such material, however, has a high TC, e. g. over plus or minus 10,000 p. p. m. (parts per million) per degree centigrade. The diverse impedance elements embodied in the circuit, including the plates of the capacitors, are bonded to the surfaces of the base 14 by any of the methods described in National Bureau of Standards, circular 468, entitled, "Printed Circuit Techniques," issued November 13, 1947. The plates of the capacitors are deposed on opposite sides of the base 14 so that it is the dielectric of such capacitors. The plates 16 and 18 of the high value capacitor 10 and the plate 20 of the low value capacitor 12 are directly bonded to the surface of the base 14. The other plate 22 of the value capacitor 12 is bonded to a thin layer 24 of low K, low TC dielectric material. In this embodiment all of the capacitor plates are of the same shape and area and the layer 24 has an area slightly larger than that of the plates to lower to negligible amounts capacitive coupling at the edge of the plate 22. Ribbon-type leads 26 may be soldered to the plates in the customary manner.

The layer 24 may consist of a vitreous enamel having a K in the range of from 5 to approximately 10. However, other strongly adhering dielectric materials having low K and low TC can be used. It is applied to the base 14 before the other elements by coating the prescribed area and firing the base to glaze and bond such layer to it. Its thickness is much less than that of the base 14. For example, the layer may be .001 inch thick and the base .030 inch thick. The material of the glaze 24 or other dielectric material capable of being bonded to the base 14 in addition to having a low K must have a low or negligible TC either positive or negative. In fact, such TC may be zero. It is also possible to select a glaze with a TC which will result in a total TC of zero for the low value capacitor 12.

The low value capacitor 12 thus formed is effectively composed of two capacitors connected in series, as if a third common plate were interposed between the base 14 and layer 24. One of these series capacitors, hereinafter designated the "ceramic" capacitor, has a high value computed by using the thickness and high K of the base 14. Its value will be equal to that of the high value capacitor 10. The other of these series capacitors, hereinafter designated the "glaze" capacitor, has a low value computed by using the thickness of the low K of the glaze 24. The value of low value capacitor 12 is the reciprocal of the sum of the reciprocals of the values of "ceramic" and "glaze" capacitors. Hence, such value will be less than the value of the "glaze" capacitor. The TC of the low value capacitor 12 equals the result of multiplying the TC of the "ceramic" capacitor by the value of capacitor 12 and dividing by the value of the "ceramic" capacitor plus the result of multiplying the TC of the "glaze" capacitor by the value of capacitor 12 and dividing by the value of the "glaze" capacitor. The first of these results will be a small part of the TC of the "ceramic" capacitor because the value of low value capacitor 12 will in all cases be much smaller than the value of the "ceramic" capacitor. The second of these results will be negligible because of the low TC of the "glaze" capacitor. Hence, the TC of low value capacitor 12 will be low even though mounted on the high K high TC base 14. It is possible to select a glaze which has a negative TC equal to the result of multiplying the TC of the "ceramic" capacitor by the value of the "glaze" capacitor and dividing by the value of the "ceramic" capacitor. Using such a glaze would result in a low value capacitor 12 which had a TC of zero and hence would be applicable in circuits demanding a critical close tolerance.

Although only one embodiment of the invention is shown and described herein, it will be understood that this application is intended to cover such changes or modifications as come within the spirit of the invention or scope of the following claims.

We claim:

1. In a printed circuit unit, a base of high K ceramic material having a first part adapted to provide the primary structural support for diverse impedance elements bonded thereto and the dielectric for a high value broadly toleranced capacitor, said base having a second part providing the support and dielectric for a low value low TC closely toleranced capacitor comprising one plate bonded to one surface of said second part, a layer of low K low TC dielectric material bonded to the other surface of said second part opposite said plate, and a second plate having an area slightly less than the area of said layer but of substantially the same area as said first plate and bonded to said layer directly opposite said first plate, said capacitor in electrical effect consisting of two capacitors connected in series one of which has said layer as a dielectric and the other of which has said base as a dielectric.

2. A capacitor as claimed in claim 1 in which said base has a K ranging from 500 to over 10,000 and a TC of substantially 10,000 p. p. m., and said layer has a K ranging from 2 to approximately 10 and a positive or negative TC of substantially zero.

3. A capacitor as claimed in claim 1 in which said layer has a negative TC equal to the result of multiplying the TC of said base by the value of a capacitor having plates identical with said plates bonded to opposite sides of a dielectric identical with said layer and dividing by the value of a capacitor having plates identical with said plates bonded to opposite sides of a dielectric identical with said base.

ALFRED S. KHOURI.
DONALD H. ZUNKER.

References Cited in the file of this patent

UNITED STATES PATENTS

| Number | Name | Date |
|---|---|---|
| 2,566,666 | Khouri | Sept. 4, 1951 |

FOREIGN PATENTS

| Number | Country | Date |
|---|---|---|
| 474,754 | Great Britain | Nov. 5, 1937 |
| 566,986 | Great Britain | Jan. 23, 1945 |
| 598,817 | Great Britain | Feb. 26, 1948 |
| 610,642 | Great Britain | Oct. 19, 1948 |